United States Patent
Jeong et al.

(10) Patent No.: US 7,706,198 B2
(45) Date of Patent: Apr. 27, 2010

(54) MULTI-CHIP AND REPAIRING METHOD BASED ON REMAINING REDUNDANCY CELLS

(75) Inventors: Jin-Kook Jeong, Seongnam-si (KR); Byeong-Yun Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 288 days.

(21) Appl. No.: 11/904,187

(22) Filed: Sep. 26, 2007

(65) Prior Publication Data

US 2008/0080275 A1   Apr. 3, 2008

(30) Foreign Application Priority Data

Oct. 2, 2006   (KR)   .................. 10-2006-0097304

(51) Int. Cl.
G11C 29/00   (2006.01)
G11C 7/00    (2006.01)

(52) U.S. Cl. .................. 365/201; 365/200; 714/711

(58) Field of Classification Search .................. 365/200, 365/201; 714/711
See application file for complete search history.

(56) References Cited

U.S. PATENT DOCUMENTS

| | | | |
|---|---|---|---|
| 5,337,318 A | 8/1994 | Tsukakoshi et al. | |
| 5,798,282 A | 8/1998 | Bertin et al. | |
| 6,141,768 A * | 10/2000 | Lin et al. | 714/8 |
| 6,696,714 B2 | 2/2004 | Hayashi et al. | |
| 6,704,228 B2 | 3/2004 | Jang et al. | |
| 6,795,942 B1 * | 9/2004 | Schwarz | 714/718 |
| 6,907,555 B1 | 6/2005 | Nomura et al. | |
| 7,237,154 B1 * | 6/2007 | Zorian | 714/711 |
| 2003/0015733 A1 | 1/2003 | Hayashi et al. | |
| 2003/0123301 A1 | 7/2003 | Jang et al. | |

FOREIGN PATENT DOCUMENTS

| | | |
|---|---|---|
| JP | 2003-36691 | 2/2003 |
| KR | 95-011968 B1 | 10/1995 |
| KR | 0181204 B1 | 12/1998 |
| KR | 20010067326 A | 7/2001 |
| KR | 20020038298 A | 5/2002 |
| KR | 2003-0052659 | 6/2003 |
| KR | 2003-0057299 | 7/2003 |
| KR | 10-2004-0065776 | 7/2004 |
| KR | 10-0498456 | 7/2005 |

* cited by examiner

*Primary Examiner*—VanThu Nguyen
(74) *Attorney, Agent, or Firm*—Mills & Onello, LLP

(57) ABSTRACT

There is provided a repair method of a multi-chip that comprises a plurality of memory chips, each of the memory chips storing information with respect to remaining redundancy cells after repairing at a chip level. The repair method includes testing one of the plurality of memory chips; when the tested memory chip is judged to be defective, checking whether the tested memory chip is repairable, based on the stored information of the remaining redundancy cells; and when the tested memory chip is judged to be repairable, repairing the tested memory chip.

16 Claims, 5 Drawing Sheets

MULTI-CHIP AND REPAIRING METHOD BASED ON REMAINING REDUNDANCY CELLS

CROSS-REFERENCE TO RELATED APPLICATIONS

This U.S non-provisional patent application claims priority under 35 U.S.C § 119 to Korean Patent Application 10-2006-0097304 filed on Oct. 2, 2006, the entire contents of which are hereby incorporated by reference.

BACKGROUND OF THE INVENTION

The present invention relates to a multi-chip and, more particularly, to a repairable multi-chip and a method repairing a multi-chip.

As recent examples of devices that have low-power functions include a smart phone, PDA, and navigation application products that utilize multi-chips, where SiP, MCP or POP technologies are applied. Such multi-chips can be formed by stacking a single control chip and two or more chips via a stack process. In this case, each of chips in a multi-chip can be a "good" chip, i.e., a chip that functions properly. But, in the case of multi-chips, there can be cells that fail with respect to timing, loading and/or resistance on an interface between chips therein after performing a stack process.

A conventional multi-chip has no repair function with respect to "badness" caused after a stack process. This can cause a large loss, considering memory cost, logic chip cost, stack process cost, testing cost, and so on.

SUMMARY OF THE INVENTION

One aspect of the present invention is directed to a repair method of a multi-chip that comprises a plurality of memory chips, each of the memory chips storing information with respect to remaining redundancy cells after repairing at a chip level. The repair method comprises: testing one of the plurality of memory chips; when the tested memory chip is judged to be defective, checking whether the tested memory chip is repairable, based on the stored information of the remaining redundancy cells; and when the tested memory chip is judged to be repairable, repairing the tested memory chip.

When the tested memory chip is judged not to be repairable, the method can include generating a signal indicating that the multi-chip is defective.

The method can further comprise repeating, for a next memory chip of the plurality of memory chips, the testing, checking if a defective memory chip is repairable, and, if so, repairing the next memory chip when the tested memory chip is judged to be good.

When the memory chips are all judged to be good, the method can include generating a signal indicating that the multi-chip is a good product.

The method can include providing a test controller within the multi-chip that controls the testing, checking, and repairing.

The method can further comprise providing the plurality of memory chips to include the memory chips that comprise: a redundancy circuit for converting an address of a defective memory cell into an address of the redundancy cell in response to a repair signal; and a redundancy control circuit for storing the information of the redundancy cell and generating the repair signal for controlling the redundancy circuit.

The redundancy circuit can comprise fuses and can be configured to convert the address of the defective memory cell into the address of the redundancy cell by selectively cutting one or more of the fuses.

The fuses can comprise electric fuses.

The method can further comprise the redundancy control circuit storing the number of remaining redundancy cells after repairing a memory chip at a chip level and determining whether the memory chip is repairable, based on the number of remaining redundancy cells.

The method can include providing an external tester and controlling the testing, checking, and repairing to be repeated with respect to a next memory chip of the plurality of memory chips when the tested memory chip is judged to be good using the external tester.

The method can include determining that the multi-chip is good when each of the plurality of memory chips are is judged to be good.

The method can include controlling the testing, checking, and repairing to be repeated with respect to the memory chip after the repairing the tested memory chip using the external tester.

Each of the memory chips can comprise: a redundancy circuit for converting an address of a defective memory cell into an address of the redundancy cell in response to a repair signal; and a redundancy control circuit for storing the information of the redundancy cell and generating the repair signal for controlling the redundancy circuit.

Another aspect of the present invention is directed to a method of repairing a multi-chip with a plurality of memory chips. The method comprises: testing one of the plurality of memory chips; and repairing the tested memory chip when the tested memory chip is judged to be defective. Each of the memory chips comprises: a redundancy circuit for converting an address of a defective memory cell into an address of a redundancy cell in response to a repair signal; and a redundancy control circuit for generating the repair signal for controlling the redundancy circuit. The redundancy circuit comprises: a first fuse box for repairing a memory chip of a single-chip state in response to a first repair signal; and a second fuse box for repairing a memory chip of a multi-chip state in response to a second repair signal.

The method can further comprise the redundancy circuit checking whether the memory chip is repaired at the single-chip state or at the multi-chip state, based on a repair command from a test controller and generating either one of the first repair signal and the second repair signal.

The redundancy circuit can comprise fuses and the method includes converting the address of the defective memory cell into the address of the redundancy cell by cutting of the fuses.

The method can further comprise the redundancy control circuit storing the number of remaining redundancy cells after repairing a memory chip at a single-chip state and determining whether the memory chip is repairable, based on the number of remaining redundancy cells.

Still another aspect of the present invention is directed to a multi-chip comprising: a plurality of memory chips; and a test controller configured to control the plurality of memory chips when testing the plurality of memory chips at a package level. Each of the plurality of memory chips comprises: a memory core having a plurality of memory cells and a plurality of redundancy cells; a redundancy circuit configured to convert defective memory cells of the memory cells into redundancy cells from the plurality of redundancy cells in response to a repair signal; and a redundancy control circuit configured to store a number of the redundancy cells used to repair at a single-chip state and to generate the repair signal in response to a repair command. The test controller is configured to check the number of the redundancy cells stored in the redundancy control circuit and to generate the repair command to be applied to the redundancy control circuit.

The redundancy circuit can be configured to convert addresses of the defective memory cells into addresses of the redundancy cells by a fuse cutting.

The fuse cutting can be conducted using an electric fuse cutting approach.

Still another aspect of the present invention is directed to a multi-chip comprising a plurality of memory chips. Each of the memory chips comprises: a memory core having a plurality of memory cells and a plurality of redundancy cells; a first fuse box configured to convert defective memory cells of a memory chip of a single-chip state into redundancy cells from the plurality of redundancy cells in response to a first repair signal; a second fuse box configured to repair defective memory cells of a memory chip of a multi-chip state into redundancy cells in response to a second repair signal; and a fuse box control circuit configured to generate the first repair signal when repairing the memory chip at a single-chip state and the second repair signal when repairing the memory chip at a multi-chip state.

Still another aspect of the present invention is directed to a multi-chip comprising a plurality of memory chips. Each of the memory chips comprises: a memory core having a plurality of memory cells and a plurality of redundancy cells; a fuse box configured to convert defective memory cells of a memory chip of a single-chip state into the redundancy cells in response to a repair signal; and a fuse box control circuit configured to store the number of redundancy cells used when repairing the memory chip at a single-chip state. The fuse box control circuit is configured to check whether the memory chip is repairable based on the number of the stored redundancy cells when repairing the memory chip at a multi-chip package state and to generate the repair signal based on the checking result.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention.

DETAILED DESCRIPTION OF PREFERRED EMBODIMENTS

Figure 1:
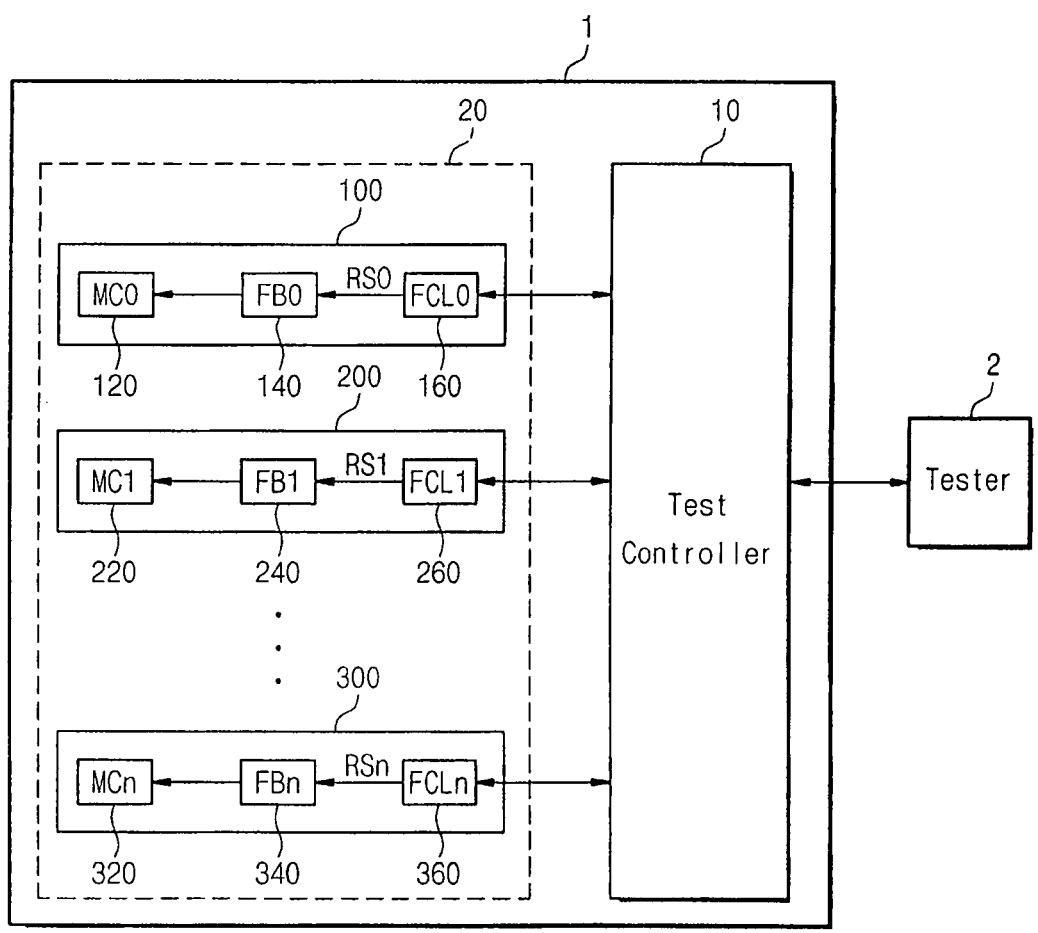
FIG. 1 shows an embodiment of a repairable multi-chip according to an aspect of the present invention.

Hereinafter aspects of the present invention will be described with reference to the accompanying drawings, in which preferred embodiments in accordance therewith are shown. The invention, however, can be embodied in many different forms and should not be construed as limited to the embodiments set forth herein. In the drawings, like numbers refer to like elements throughout.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

FIG. 1 shows an embodiment of a repairable multi-chip according to an aspect of the present invention. Referring to FIG. 1, a multi-chip 1 can include a test controller 10 and a plurality of memory chips 20.

The test controller 10 receives a test signal from a tester 2 to control test operations with respect to the respective memory chips. The test controller 10 is configured to control sequential testing of memory chips in the multi-chip 1. The test controller 10 checks whether the memory chips 100 to 300 are defective through testing and repairing of the memory chips 100 to 300, and outputs to the tester a signal indicating whether the multi-chip 1 is "good," i.e., functioning properly.

The memory chips 100 to 300 are configured to have a stack structure, such a structure is generally known in the art. The respective memory chips 100 to 300 include memory cores 120, 220, and 320, fuse boxes 140, 240, and 340, and fuse control logics 160, 260, and 360. Herein, the respective memory chips 100 to 300 are chips that have been judged to be good at a single-chip test level. But each of the memory chips 100 to 300 can fail after a stack process, even though they were judged to be good at the single-chip test level.

Figure 2:
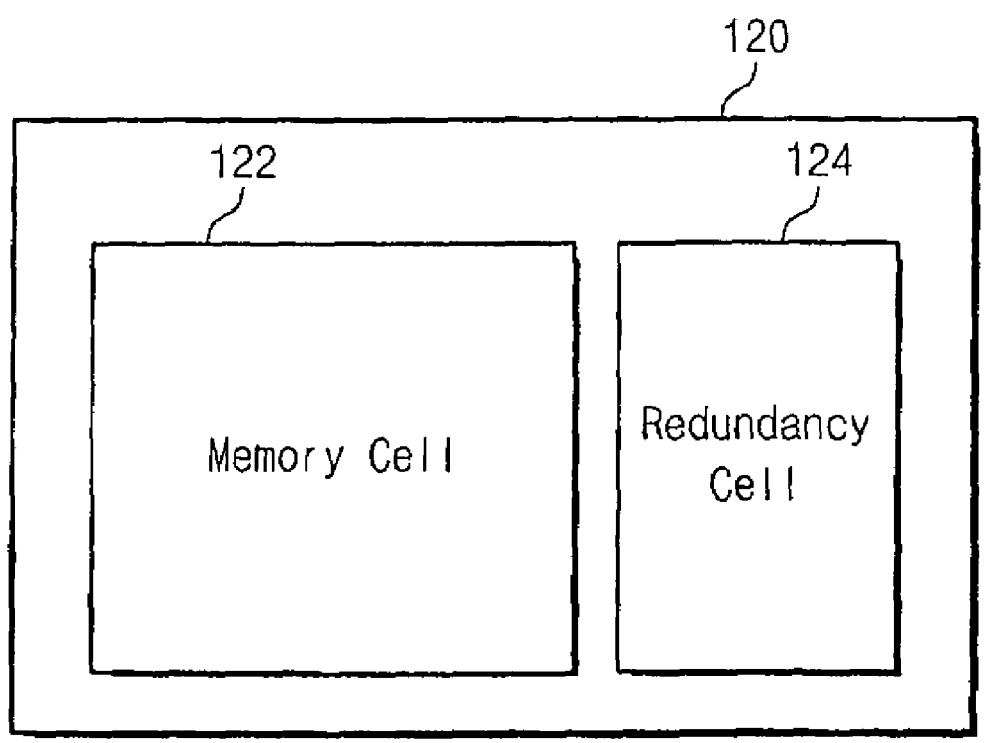
FIG. 2 shows an embodiment of a memory core of a memory chip according to an aspect of the present invention.

Each of the memory cores 120, 220, and 320 can include a plurality of memory cells and a plurality of redundancy cells. FIG. 2 shows an embodiment of a memory core 120 of a memory chip 100, according to aspects of the present invention. Referring to FIG. 2, memory core 120 can include a plurality of memory cells 122 and a plurality of redundancy cells 124, as can memory cores 220 and 320 in FIG. 1.

Returning to FIG. 1, the fuse boxes 140, 240, and 340 are used for fuse cutting programming in order to convert an address of a defective memory cell into an address of a redundancy cell. The fuse cutting programming approach can include an electric fuse approach, a laser fuse approach, an EEPROM cell approach, and the like.

Each of the fuse control logics 160, 260, and 360 can generate a repair signal RSi (where i=0-n) for converting addresses of defective memory cells into addresses of redundancy cells, and can transfer the repair signal RS to a corresponding fuse box. The fuse boxes 140, 240, and 340 cut fuses in response to the repair signals RS0 to RSn, respectively, so that an address of a defective memory cell is converted into an address of a redundancy cell.

In a case where defective cells are detected by testing the memory chips 100 to 300 in the multi-chip, the fuse control logics 160, 260, and 360 check whether the memory chips 100 to 300 are repairable and transfer the repair signals RS0 to RSn to the fuse boxes 140, 240, and 340, respectively.

The fuse control logics 160, 260, and 360 can include a counter (not shown) for checking the number of redundancy cells remaining in the memory chips 100 to 300 after testing at a single-chip state. The counter counts and stores the number of redundancy cells used for repairing after a single-chip testing. The respective fuse control logics 160, 260, and 360 check the number of used redundancy cells stored in the counter and determine whether defective memory cells in the respective memory chips 100 to 300 are repairable. If one or more defective memory cells in the memory chips 100 to 300 are judged not to be repairable, the corresponding fuse control logics 160, 260, and 360 generate a signal indicating that a corresponding memory chip is not repairable, and transfers the signal to the test controller 10.

Therefore, multi-chip 1, according to aspects of the present invention, includes the fuse control logics 160, 260, and 360 to test and repair the memory chips 100 to 300 in the multi-chip 1.

Figure 3:
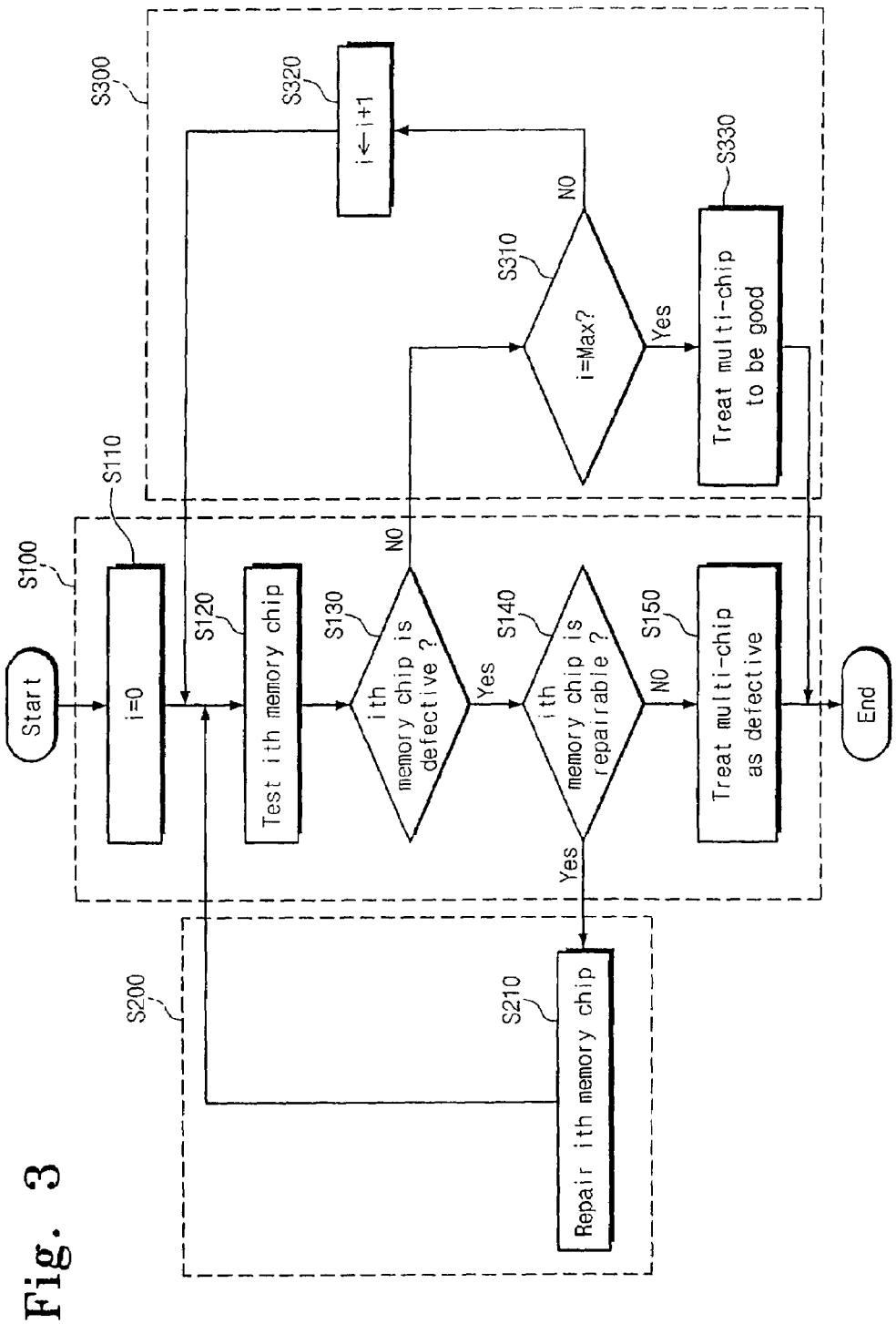
FIG. 3 is an embodiment showing a repair method of memory chips in a multi-chip according to an aspect of the present invention.

FIG. 3 is an embodiment of a repair method that can be used with respect to memory chips in a multi-chip, according to an aspect of the present invention. The method will be described with to respect to multi-chip 1 of FIG. 1, as an example.

Step S100 shows a defect processing procedure of a multi-chip 1. Step S200 shows a repair procedure of memory chips 100 to 300 in the multi-chip 1. Step S300 shows a procedure of processing a good product.

The step S100 includes a set of internal steps, as follows. In step S110, a memory chip to be tested, from among the memory chips 100 to 300 in the multi-chip 1, is selected. A test controller 10 tests the memory chips 100 to 300 in response to a test signal from the tester 2, in step 120. Herein, for convenience of description, assume that a memory chip 100 is tested when i=0 and a memory chip 200 is tested when i=1.

In step S120, the selected ith memory chip 100 is tested. Herein, testing is testing using a self-test function. For example, testing can be built-in self-repair (BIRA) testing. According to the BIRA testing, test and redundancy checking operations are performed on a memory chip having row and column redundancy, repair information for a defective memory chip is output, and a repair operation is conducted through fuse cutting, if needed.

In step S130, there is a check to determine whether the tested memory chip 100 is defective.

In step S140, when the memory chip 100 includes defective memory cells, there is a check to determine whether the memory chip 100 is repairable. A fuse control logic 160 checks remaining redundancy cells using the number of redundancy cells used at a single-chip state, compares the checked number with the number of defective memory cells, and determines if the memory chip 100 can repairable based on the comparison result. If repairable, the fuse control logic 160 generates a repair signal RS0 and transfers the repair signal RS0 to a corresponding fuse block 140. If memory chip 100 is not repairable, the fuse control logic 160 generates a signal indicating that the memory chip 100 is defective, and transfers the signal to the test controller 10.

In step S150, the multi-chip 1 is determined to be defective according to the transferred signal indicating that the memory chip 100 is defective.

The step S200 includes a set of internal steps, as follows. In step S210, the repairable memory chip is repaired, as discussed above. The fuse box 140 conducts fuse cutting in response to the repair signal RS0 from the fuse control logic 160, so that an address of a defective memory cell is converted into an address of a redundancy cell. Accordingly, it is possible to repair the memory chip 100 having defective memory cells. And then, the procedure goes to the step S120 in order to check whether the repaired memory chip 100 is normally repaired.

The step S300 includes a set of internal steps, as follows. If in step S130 the checked determined that the memory chip was not defective, the method continues to step S310, where a check is performed to determine whether all memory chips 100 to 300 have been tested, i.e., whether i=Max. If not, the procedure goes to step S320. If so, the procedure goes to step S330, in which the multi-chip 1 is treated to be good.

In step 320, i is incremented and a next memory chip 200 is selected. After determining that memory chip 100 is good, the test controller 10 transfers a control signal to the memory chip 200 in order to test the memory chip 200, which is a return to step S120 for memory chip 200. Test and repair operations for the memory chip 200 are conducted in the same manner as above described.

Figure 4:
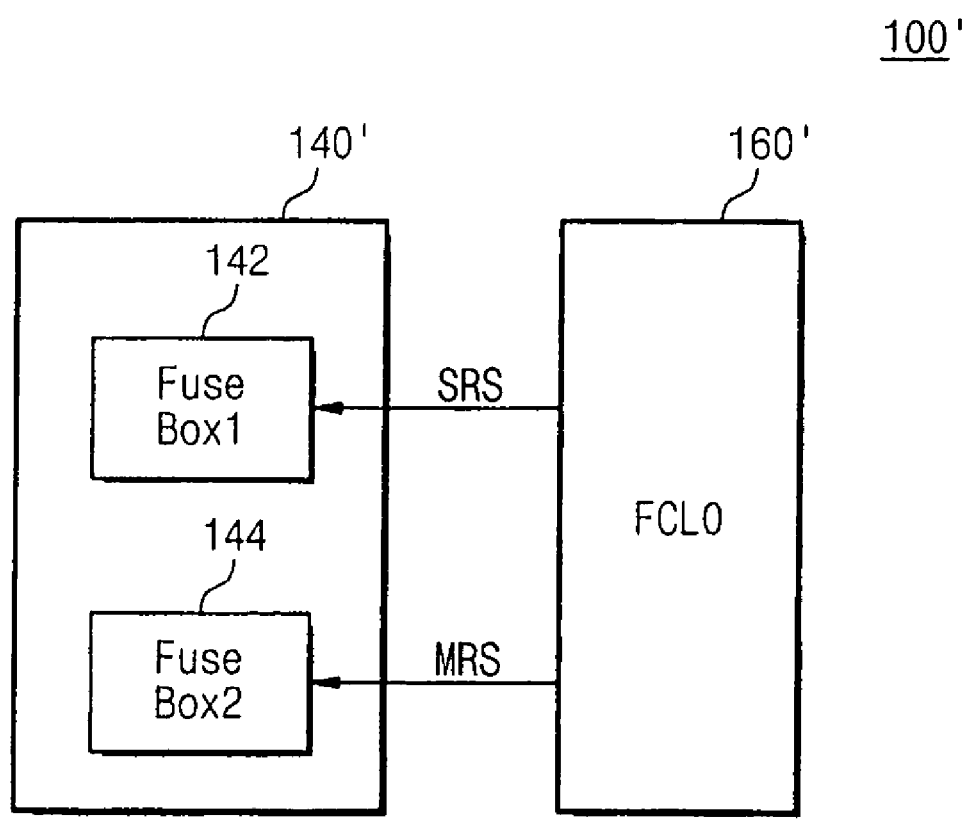
FIG. 4 shows another embodiment of a fuse box according to an aspect of the present invention.

FIG. 4 shows another embodiment of a fuse box and a fuse control block according to an aspect of the present invention.

Referring to FIG. 4, a fuse box 100' can include a fuse box 140' that can include a first fuse box 142 and a second fuse box 144. The first fuse box 142 can include fuses that are used to test and repair a memory chip 100 at a single-chip state. The second fuse box 144 can include fuses that are used to test and repair the memory chip 100' at a multi-chip state.

The fuse control box 160' generates a repair signal SRS at single-chip testing and transfers the repair signal SRS to the first fuse box 142. Meanwhile, when testing the memory chip 100 at a multi-chip state, the fuse control block 160' generates a repair signal MRS in response to a test signal from the test controller 10 and transfers the repair signal MRS to the second fuse box 144.

In FIG. 4, a configuration for the memory chip 100' is illustrated, as an alternative to memory chip 100 in FIG. 1. Similarly, configurations of memory chips 200 and 300 in FIG. 1 can be the same as the memory chip 100' in FIG. 4.

Figure 5:
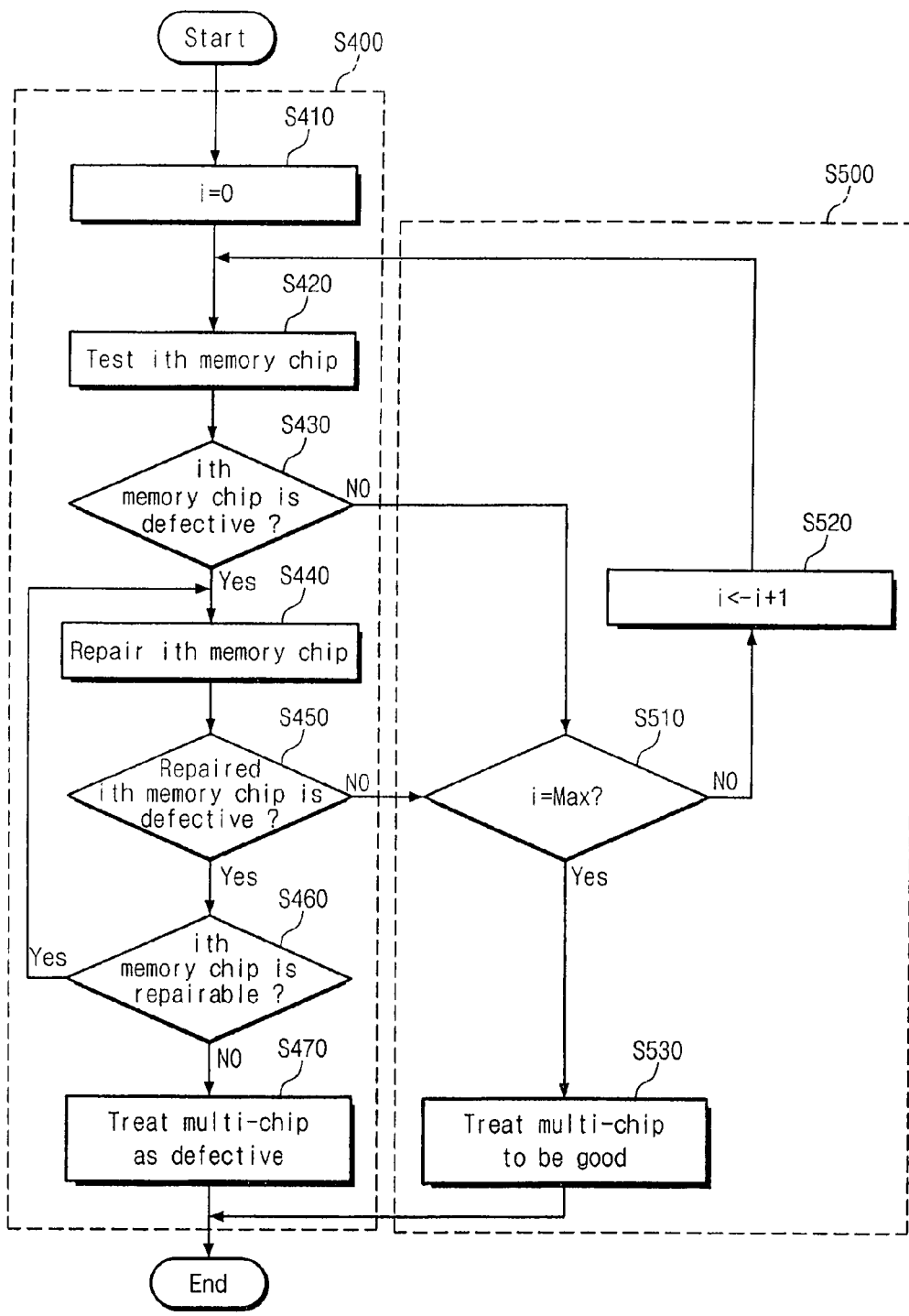
FIG. 5 shows a repair method of memory chips in a multi-chip including memory chips illustrated in FIG. 4.

FIG. 5 shows an embodiment of a repair method of memory chips in a multi-chip using a fuse box and a fuse control logic as illustrated in FIG. 4. The method will be described with to respect to multi-chip 1 of FIG. 1, as an example, wherein memory chips 100 to 300 are referred to as memory chips 100' to 300' having the configuration of memory chip 100' in FIG. 4. Referring to FIG. 5, a repair method can include a procedure S400 for processing a bad product and a procedure S500 for processing a good product.

The step S400 includes a set of internal steps, as follows. In step S410, a test controller 10 selects a memory chip 100' from among a plurality of memory chips 100' to 300' in response to a test signal from a tester 2, wherein "i" is initially set to "0" for memory chip 100'.

In step S420, the selected memory chip 100' is tested. The test controller 10 can test the selected memory chip 100' in response to the test signal.

In step S430, there is determination made of whether the memory chip 100' is defective. The test controller 10 checks whether the tested memory chip 100' has defective memory cells. If the tested memory chip 100' has defective memory cells, the test controller 10 outputs a repair command to the fuse control block 160'.

In step S440, the memory chip 100 having defective memory cells is repaired. The fuse control block 160' generates a repair signal MRS in response to the repair command from the test controller 10 and outputs the repair signal MRS to a second fuse box 144 in a fuse box 140'. Herein, the second fuse box 144 is a fuse box for a multi-chip. The second fuse box 144 conducts fuse cutting in response to the repair signal MRS, so that an address of defective memory cells is converted into an address of redundancy cells.

In step S450, the repaired memory chip 100 is again tested to determine whether the repaired memory chip 100' is defective.

In step S460, a determination made of whether defective memory cells of the memory chip 100' are repairable. The test controller 10 checks the defective memory cells of the repaired memory chip 100' and outputs a test signal to the fuse control block 160'. The fuse control block 160' compares the number of redundancy cells with the number of defective memory cells in response to the test signal, and determines whether the memory chip 100' is repairable. If so, the fuse control block 160' outputs the repair signal MRS to the second fuse box 144 of the fuse box 140'. And then, the procedure goes to the step S440. If not, the fuse control block 160' outputs to the test controller 10 a signal indicating the badness of the memory chip 100.

In step S470, the multi-chip 1 is treated as defective. That is, the test controller 10 generates a signal for indicating the badness of the multi-chip 1 in response to a badness signal from the fuse control block 160' and outputs the signal to the tester 2.

The step S500 includes a set of internal steps, as follows. In step S510, when the memory chip 100' is not defective, in steps S430 or S450, there is a determination made of whether all memory chips 100' to 300' have been tested. If not, the procedure goes to step S520. If so, the procedure goes to step S530.

In step 520, "i" is incremented and a next memory chip 200' is selected. After checking the memory chip 100' to be good, the test controller 10 transfers a test signal to the memory chip 200' in order to test the memory chip 200'. Test and repair operations for the memory chip 200' are conducted in the same manner as above described.

In step S530, the test controller 10 outputs to the tester 2 a signal indicating that the multi-chip 1 is good.

Although aspects of the present invention have been described in connection with the embodiment illustrated in the accompanying drawings, the present invention is not limited thereto. It will be apparent to those skilled in the art that various substitution, modifications and changes can be made thereto without departing from the scope and spirit of the invention. It is intended by the following claims to claim that which is literally described and all equivalents thereto, including all modifications and variations that fall within the scope of each claim.

What is claimed is:

1. A repair method of a multi-chip that comprises a plurality of memory chips, each of the memory chips storing information with respect to remaining redundancy cells after repairing at a chip level, the repair method comprising:

testing one of the plurality of memory chips;

when the tested memory chip is judged to be defective, checking whether the tested memory chip is repairable, based on the stored information of the remaining redundancy cells; and when the tested memory chip is judged to be repairable, repairing the tested memory chip, wherein when the tested memory chip is judged not to be repairable, the method includes generating a signal indicating that the multi-chip is defective.

2. The repair method of claim 1, further comprising:

repeating, for a next memory chip of the plurality of memory chips, the testing, checking if a defective memory chip is repairable, and, if so, repairing the next memory chip when the tested memory chip is judged to be good.

3. The repair method of claim 2, wherein when the memory chips are all judged to be good, the method includes generating a signal indicating that the multi-chip is a good product.

4. The repair method of claim 2, providing a test controller within the multi-chip that controls the testing, checking, and repairing.

5. The repair method of claim 1, further comprising providing the plurality of memory chips to include the memory chips that comprise:

a redundancy circuit for converting an address of a defective memory cell into an address of the redundancy cell in response to a repair signal; and a redundancy control circuit for storing the information of the redundancy cell and generating the repair signal for controlling the redundancy circuit.

6. The repair method of claim 5, wherein the redundancy circuit comprises fuses and is configured to convert the address of the defective memory cell into the address of the redundancy cell by selectively cutting one or more of the fuses.

7. The repair method of claim 6, wherein the fuses comprise electric fuses.

8. The repair method of claim 7, further comprising the redundancy control circuit storing the number of remaining redundancy cells after repairing a memory chip at a chip level and determining whether the memory chip is repairable, based on the number of remaining redundancy cells.

9. The repair method of claim 1, including providing an external tester and controlling the testing, checking, and repairing to be repeated with respect to a next memory chip of the plurality of memory chips when the tested memory chip is judged to be good using the external tester.

10. The repair method of claim 9, including determining that the multi-chip is good when each of the plurality of memory chips is judged to be good.

11. The repair method of claim 10, including controlling the testing, checking, and repairing to be repeated with respect to the memory chip after the repairing the tested memory chip using the external tester.

12. The repair method of claim 11, wherein each of the memory chips comprises:

a redundancy circuit for converting an address of a defective memory cell into an address of the redundancy cell in response to a repair signal; and a redundancy control circuit for storing the information of the redundancy cell and generating the repair signal for controlling the redundancy circuit.

13. A multi-chip comprising:

a plurality of memory chips; and a test controller configured to control the plurality of memory chips when testing the plurality of memory chips at a package level, wherein each of the plurality of memory chips comprises:
a memory core having a plurality of memory cells and a plurality of redundancy cells;
a redundancy circuit configured to convert defective memory cells from the plurality of memory cells into redundancy cells from the plurality of redundancy cells in response to a repair signal; and
a redundancy control circuit configured to store a number of the redundancy cells used to repair at a single-chip state and to generate the repair signal in response to a repair command,
wherein the test controller is configured to check the number of the redundancy cells stored in the redundancy control circuit and to generate the repair command to be applied to the redundancy control circuit, and
wherein when the tested memory chip is judged not to be repairable, the test controller generates a signal indicating that the multi-chip is defective.

14. The multi-chip of claim 13, wherein the redundancy circuit is configured to convert addresses of the defective memory cells into addresses of the redundancy cells by a fuse cutting.

15. The multi-chip of claim 14, wherein the fuse cutting is conducted using an electric fuse cutting approach.

16. A multi-chip comprising a plurality of memory chips, wherein each of the memory chips comprises:
a memory core having a plurality of memory cells and a plurality of redundancy cells;
a fuse box configured to convert defective memory cells of a memory chip of a single-chip state into redundancy cells from the plurality of redundancy cells in response to a repair signal; and
a fuse box control circuit configured to store the number of redundancy cells used when repairing the memory chip at a single-chip state, the fuse box control circuit configured to check whether the memory chip is repairable based on the number of the stored redundancy cells when repairing the memory chip at a multi-chip package state and to generate the repair signal based on the checking result, and when the tested memory chip is judged not to be repairable, the fuse box control circuit is configured to generate a signal indicating that the multi-chip is defective.

* * * * *